United States Patent
Nakao

(10) Patent No.: US 7,459,966 B2
(45) Date of Patent: Dec. 2, 2008

(54) OFFSET ADJUSTING CIRCUIT AND OPERATIONAL AMPLIFIER CIRCUIT

(75) Inventor: Tomoaki Nakao, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 150 days.

(21) Appl. No.: 11/411,106

(22) Filed: Apr. 26, 2006

(65) Prior Publication Data

US 2006/0255855 A1 Nov. 16, 2006

(30) Foreign Application Priority Data

Apr. 28, 2005 (JP) ............... 2005-133212

(51) Int. Cl.
*H03F 1/02* (2006.01)

(52) U.S. Cl. .......................................... 330/9

(58) Field of Classification Search .......... 330/9, 330/124, 307
See application file for complete search history.

(56) References Cited

U.S. PATENT DOCUMENTS

| | | | |
|---|---|---|---|
| 4,356,450 A | 10/1982 | Masuda | |
| 5,397,944 A * | 3/1995 | DuPuis | 327/307 |
| 5,900,748 A * | 5/1999 | Miyama et al. | 327/65 |
| 6,459,335 B1 * | 10/2002 | Darmawaskita et al. | 330/9 |
| 7,081,785 B2 * | 7/2006 | Mori et al. | 327/307 |
| 2005/0057379 A1 * | 3/2005 | Jansson | 341/120 |

FOREIGN PATENT DOCUMENTS

| | | |
|---|---|---|
| JP | 56-76613 | 6/1981 |
| JP | 60-142613 A | 7/1985 |
| JP | 62-247611 | 10/1987 |
| JP | 04-274605 | 9/1992 |
| JP | 05-129848 | 5/1993 |
| JP | 6-232706 A | 8/1994 |
| JP | 06-314490 | 11/1994 |
| JP | 09-148930 | 6/1997 |
| KR | 1999-17139 | 3/1999 |
| KR | 2001-48965 | 6/2001 |
| KR | 2001-105706 | 11/2001 |
| WO | WO 02/084862 A1 | 10/2002 |

* cited by examiner

*Primary Examiner*—Robert Pascal
*Assistant Examiner*—Khiem D Nguyen
(74) *Attorney, Agent, or Firm*—Harness, Dickey & Pierce, PLC

(57) ABSTRACT

The present invention provides an offset adjusting circuit and an operational amplifier circuit. In the operational amplifier circuit (1), a switching element (S1) is closed and a switching element (S2) is opened. The latch circuit DL latches an output voltage of an operational amplifier (1a), and output a Q-output in accordance with the output voltage. The control circuit (2a) inputs an offset adjustment signal s1 to an offset adjustment input terminal OR of the operational amplifier (1a). Then, the latch circuit DL latches the output voltage having been subjected to the offset adjustment, and the offset adjustment signal s1 is finely adjusted for adjusting the remaining offset. In this way, the offset in the output voltage of the operational amplifier (1a) is quantized in accordance with the number of times the latching operation has been performed, and is stored in the control circuit (2a) in the form of a binary logical signal.

12 Claims, 8 Drawing Sheets

OFFSET ADJUSTING CIRCUIT AND OPERATIONAL AMPLIFIER CIRCUIT

This Nonprovisional application claims priority under 35 U.S.C. § 119(a) on Patent Application No. 2005/133212 filed in Japan on Apr. 28, 2005, the entire contents of which are hereby incorporated by reference.

FIELD OF THE INVENTION

The present invention relates to an offset adjustment for an operational amplifier circuit. Particularly, the present invention is for reducing a variation in a random offset of an output operational amplifier circuit in a TFT-LCD source driver circuit, which offset is caused by a production-caused variation.

BACKGROUND OF THE INVENTION

In general, a TFT-LCD drive circuit drives a liquid crystal panel by (i) digitally processing a display signal, and (ii) converting, with a use of a DA converter, the digitally processed display signal into an analogue voltage according to a display tone of the display signal In recent years, a load of the liquid crystal panel has been increasingly becoming large for a given drive circuit, with an increase in the size of the liquid crystal panel. On this account, in general, a low-output-impedance output circuit is formed as a voltage follower circuit by using an operational amplifier, and an output signal from the DA converter is input to this low-output-impedance output circuit. Thus, the output signal from the DA converter is converted into an output signal from the low-output-impedance output circuit, and this output signal from the output circuit is used for driving a liquid crystal panel.

FIG. 9 illustrates an exemplary configuration of a TFT-LCD module. In the TFT-LCD module, a liquid crystal panel 101 is driven by a plurality of gate driver circuits 103 and a plurality of source driver circuits 104, each of which is controlled by a control circuit 102.

FIG. 10 illustrates a configuration of each of the source driver circuits 104. Each source driver circuit 104 includes, sequentially from a side of the control circuit 102 towards a side of the liquid crystal panel 101: shift registers 104a; sampling latch circuits 104b; hold latch circuits 104c; level shifting circuits 104d; DA converter circuits 104e; and output amplifiers 104f.

Further, FIG. 11 illustrates an exemplary configuration of the TFT-LCD source driver circuit 104 for each output terminal. In the following explanation with reference to FIG. 10, it is assumed that display data is in 6 bits. For each bit of the 6 bit display data, one of the sampling latch circuits 104b, one of the hold latch circuits 104c, and one of the level shifting circuit 104d are provided.

Each bit of the display data is sampled in the sampling latch circuit 104b in response to an input of a start pulse signal forwarded via the shift register 104a (the process is not shown). Then, in the hold latch circuit 104c, each of the 6 bits is latched in response to a latch signal (horizontal sync. signal) (the process is not shown). After a signal level of the display data is converted in the level shifting circuit 104d, a voltage for tone display is selected in the DA converter circuit 104e, in accordance with the display data (6 bits in this case). Then, the selected voltage for tone display is output to the liquid crystal panel 101, from the output amplifier 104f which is configured by a voltage follower circuit.

In FIG. 11, the shift register 104a, the sampling latch circuit 104b, and the hold latch circuit 104c are conventionally a logical circuit. Further, the DA converter circuit 104e and the output amplifier 104f are analogue circuits. As described, the output amplifier 104f is usually a voltage follower circuit which is configured by an operational amplifier. The level shifter circuit 104a is provided between the logical circuit and the analogue circuit. This level shifter circuit 104a converts a voltage level of a logical signal into a voltage level for image displaying on the liquid crystal panel 101. An LSI of the TFT-LCD source driver circuits 104 (Hereinafter, source driver LSI) includes therein a plurality of the circuits illustrated in FIG. 11, and an output voltage of each of the circuits drives each display data line of the liquid crystal panel 101.

Ideally, a voltage output from the voltage follower circuit (i.e. output amplifier 104f) which is configured by the operational amplifier is equal to a voltage input to the voltage follower circuit. However, in an actual LSI, due to a production-caused variation, there is a random variation in the voltages respectively output from the operation amplifiers in the LSI. This random variation is called "offset variation". If this offset variation occurs in the source driver LSI, drive voltages to be respectively applied to the display data lines of the liquid crystal panel 101 vary on a line-by-line basis. The display brightness of the liquid crystal panel 101 is controlled by the drive voltage applied to the display data line. Thus, the line-by-line variation in the drive voltages applied to the data lines causes a non-uniform displaying. Accordingly, in the source driver LSI, the variation in the respective output voltages from the plurality of the liquid crystal driving voltage output terminals needs to be restrained to a level at which the displaying quality is not affected.

This offset variation of the operational amplifier in the source driver LSI is mainly attributed to a difference (mismatching) in finish properties of paired elements whose properties are supposed to be identical. In general, such an offset variation has been reduced as follows. Namely, the size of a circuit element configuring in an operational amplifier is enlarged, and an extra caution is taken for arrangement of the circuit element in a layout designing process using a mask. Further, an offset adjusting circuit is added for adjusting an offset in an amplifier. For the offset adjusting circuit, various conventional methods are suggested.

FIG. 6 illustrates a first example of a conventional offset adjusting circuit. This first example is disclosed in, for example, Japanese National Publication WO publication WO 02084862 (Tokuhyou 2004-519969; published on Jul. 2, 2004: hereinafter Publication 1). FIG. 6 illustrates: a common phase input terminal IN101; a negative-phase input terminal IN102; an output terminal OUT101; and a capacitor C101 for storing and retaining therein an offset adjustment voltage. Further, the offset adjusting circuit of FIG. 6 includes two switching elements S101 and a single switching element S102. Note that, in the present specification, including the description regarding this example, an input terminal of an operational amplifier is referred to as non-inverting input terminal or inverting input terminal, and is distinguished from: a common phase input terminal for inputting a signal to the non-inverting input terminal; and a negative-phase input terminal for inputting a signal to the inverting input terminal, unless otherwise notified.

The capacitor C101 is provided between (i) the inverting input terminal of the operational amplifier 111 and (ii) the negative-phase input terminal IN102. Further, one of the switching elements S101 is provided between the common phase input terminal IN101 and a point between the capacitor C101 and the negative-phase input terminal IN102. Another one of the switching elements S101 is provided between the output terminal of the operational amplifier 111 and the inverting input terminal. The switch S102 is provided between the negative-phase input terminal IN102 and the capacitor C101. Further, the offset voltage of the operational amplifier 111 is a voltage source Voff located between the non-inverting input terminal of the operational amplifier 111 and the common phase input terminal IN101.

This circuit adjusts an offset by alternating between (i) a storing status during which an offset adjustment voltage is stored, and (ii) a normal state during which the circuit serves as an ordinal operational amplifier. The switch S101 is closed, and the switch S102 is opened. Thus, the circuit enters in the storing status. At this point, the capacitor C101 are charged by the electric potential of the voltage Voff. Then, the switch S101 is opened and the switch S102 is closed. Thus, the circuit enters the normal status. At this point, a difference between the electrical potentials at the both ends of the capacitor C101 equals to the Voff. Therefore, the offset voltage is cancelled.

FIG. 7 and FIG. 8 illustrate a second example of the conventional offset adjusting circuit. FIG. 7 illustrates an exemplary configuration of a CMOS operational amplifier circuit to which an offset adjusting circuit is added. FIG. 8 illustrates an example where the circuit of FIG. 7 is applied to a voltage follower circuit.

The operational amplifier circuit of FIG. 7 includes: adjustment input terminals AUX1 and AUX2 for use in offset adjustment; a common phase input terminal IN111 (non-inverting input terminal); and a negative-phase input terminal IN112 (inverting input terminal). This operational amplifier circuit further includes: (i) a first difference input pair including NMOS transistors T102 and T103; (ii) a second difference input pair including NMOS transistors T105 and T106. The first difference input pair takes, as a bias current, a drain current of an NMOS transistor T101, and the second difference input pair takes, as a bias current, a drain current of an NMOS transistor T104. Further, the first and second difference input pairs share a common active load which is a current mirror circuit including PMOS transistors T107 and T108. The first difference input pair serves as an input section of the offset adjusting circuit. The gate terminal of the NMOS transistor T102 is connected to the common phase input terminal IN111, and the gate terminal of the NMOS transistor T103 is connected to the negative-phase input terminal IN112. The second difference input pair serves as an input section for an offset adjusting voltage. The gate terminal of the NMOS transistor T105 is connected to the adjustment input terminal AUX1, and the gate terminal of the NMOS transistor T106 is connected to the adjustment input terminal AUX2.

Further, the offset adjusting circuit includes an output transistor which is the PMOS transistor T110. This output transistor takes, as a bias current, a drain current of the NMOS transistor T109. The gate terminal of the PMOS transistor T110 is connected to (i) the drain terminal of the NMOS transistor T102 of the first difference input pair and (ii) the drain terminal of the NMOS transistor T105 of the second difference input pair. A voltage to be applied to the gate terminal of the PMOS transistor T110 is determined based on (i) a drain current flowing in the first difference input pair, and (ii) a drain current flowing in the second difference input pair. Based on this voltage, a current to be output from the drain terminal of the PMOS transistor T110 is determined, the drain terminal being connected to the output terminal OUT111 which serves as an output terminal of the offset adjusting circuit.

In the application example illustrated in FIG. 8, the offset adjusting circuit of FIG. 7 is used as an operational amplifier 121. Further, three switching elements S121, a single switching element S122, and capacitors C111 and C112 are provided around the operational amplifier 121. A non-inverting input terminal of the operational amplifier 121 corresponds to the common phase input terminal IN111 of FIG. 7, and an inverting input terminal of the operational amplifier 121 corresponds to the negative-phase input terminal IN112 of FIG. 7. The offset voltage of the operational amplifier 121 is a voltage source Voff provided between (i) a non-inverting input terminal of the operational amplifier 121 and (ii) an input terminal IN121 of the voltage follower circuit.

Here, the point-A is a connection point via which the input terminal IN121 and the voltage source Voff are connected to each other, and the point-B is the inverting input terminal of the operational amplifier 121. One of the switching elements 121 is connected between the point-A and the point-B. Further, the switching element 122 is provided between the point-B and the output terminal of the operational amplifier 121.

The capacitor C111 is connected between an adjustment input terminal AUX1 and a GND, and the capacitor C112 is connected between the adjustment input terminal AUX2 and the GND. Another one of the switching elements S121 is provided between the point-A and the adjustment input terminal AUX1, and another one of the switching elements S121 is connected between an output terminal OUT121 of the voltage follower circuit and the adjustment input terminal AUX2.

Next, the following describes an operation of the voltage follower circuit illustrated in FIG. 8.

This circuit adjusts an offset by alternating between (i) a storing status during which an offset adjustment voltage is stored and (ii) a normal status during which the circuit functions as an ordinal operational amplifier. The switch S121 is closed and the switch S122 is opened. Thus, the circuit enters in the storing status. At this point, the point-A and the point-B are short-circuited, and have the same electric potential. An input voltage is applied to the adjustment input terminal AUX1, and is stored in the capacitor C111. Further, an output voltage of the operational amplifier 121 is feedbacked to the adjustment input terminal AUX2. The operational amplifier 121 is a circuit whose difference input terminal is the adjustment input terminals AUX1 and AUX2, and functions as a voltage follower. The output voltage of this operational amplifier 121 is stored in the capacitor C112. The voltage stored at this point in the capacitor C112 is a voltage for balancing the operational amplifier 121 while the voltages of the point-A and the point-B are the same.

Next, the switching element S121 is opened, and the switching element S122 is closed. Thus, the operational amplifier enters the normal status. The point-B and the output terminal of the operational amplifier 121 (i.e. the output terminal OUT121) are short-circuited via the switching element S122. The capacitor C111 and C112 store and maintain such an electric potential that voltages of the point-A and the point-B are equal to each other. As a result, the same voltage as the voltage at the point-A is output to the output terminal OUT 121 which has been short-circuited to the point-B. Thus, an output from the voltage follower has no offset voltage.

Other than the above described technologies, various methods and/or configurations for offset adjustment are disclosed in: the above-described WO 02084862, and Japanese Unexamined Patent Publications No. 274605/1992 (Tokukaihei 4-274605; published on Sep. 30, 1999), and No. 314490/1994 (Tokukaihei 6-314490; published on Jan. 8, 1994). All the methods and configurations disclosed in these publications adjust an offset by storing, in a capacitor, an offset adjustment voltage of an operational amplifier. Despite the variety in the circuit configurations, any of these methods are based on the following principle. Namely, while a common phase input terminal and a negative-phase input terminal are short-circuited, (i) a negative feedback process is carried out with respect to an offset adjusting terminal so that an output voltage of an operational amplifier is balanced at a medium electric potential between positive and negative power source voltages, and (ii) the voltage is stored in a capacitor. In these methods, an offset is adjusted by periodically alternating a status of an offset adjusting circuit, between (i) a storing status during which an offset adjustment voltage is stored and (ii) a normal status during which the offset adjusting circuit functions as a normal operational amplifier.

Conventionally, an offset variation amongst drive terminals in a source driver LSI has been reduced by: (i) increasing the size of a configuring element which influences a random variation, so that a matting is improved; and and/or (ii) designing a circuit in consideration of a symmetrical property of a mask layout for an LSI. These methods, however, lead to an increase in the size of a chip and in the production cost, when an offset adjusting circuit is formed into an LSI.

Another method for reducing the offset variation is to provide an offset adjusting circuit in a source driver LSI. A conventional offset adjusting circuit adjusts an offset by storing in a capacitor an offset adjustment voltage of an operational amplifier. Such an offset circuit includes a capacitor for offset adjustment, and a switching element. In an LSI having a typical CMOS configuration, the switching element is an MOS-FET. In the MOS-FET switch, a phenomenon so-called gate feed through occurs. This gate feed through is a phenomenon in which a charge is injected through a parasitic capacitance or the like, which capacitance is caused by a change in an electrical potential of a gate signal. Due to the charge injection, charge content stored in an offset adjustment capacitor deviates from an expected value. For the purpose of reducing such an influence, it has been suggested that a capacitor be enlarged, and that an offset adjustment voltage be sampled by using a differential circuit, as in the second example of the offset adjusting circuit. However, in either case, an increase in a circuit scale is inevitable. This leads to an increase in a chip size and to an increase in a production cost, when an offset adjusting circuit is formed into an LSI.

Further, a voltage to be stored in a capacitor is an analogue voltage according to an offset voltage of an operational amplifier. This voltage to be stored in a capacitor varies with elapse of time due to a leak current or the like. It is therefore necessary to periodically refresh the voltage stored in the capacitor. On this account, in the configuration using a capacitor, an offset is adjusted by repetitively alternating the status of the offset adjusting circuit between (i) a storing status during which an offset adjustment voltage is stored and (ii) a normal status during which the offset adjusting circuit functions as a normal operational amplifier. During the offset adjustment voltage storing status, the offset adjusting circuit is not able to function as an ordinal amplifier. As such, period during which an output signal cannot be used periodically occurs.

A period for applying a display voltage to each pixel has been shortened in a recent enlarged liquid crystal panel whose number of display pixels has been increased. Therefore, it is necessary to apply a voltage at a high speed. For this reason, a liquid crystal drive circuit is preferably capable of carrying out a consecutive voltage output. This makes it extremely difficult to adopt the conventional offset adjusting circuit. In order to solve this problem, it is suggested that two pairs of circuits be prepared, and that the two pairs of circuits alternately carry out an output drive, thereby realizing the consecutive driving. However, this method doubles a circuit scale. Therefore, an increase in the cost is inevitable.

SUMMARY OF THE INVENTION

An object of the present invention is to provide an offset adjusting circuit which is capable of adjusting an offset by absorbing a small scale offset variation, and which does not require a frequent refreshing process.

In order to achieve the object, an offset adjusting circuit of the present invention(A) converts an output voltage of an operational amplifier into a binary logical signal, (B) stores the binary logical signal, and (C) uses the binary logical signal for adjusting an offset in the output voltage, said output voltage being output from the operational amplifier while (i) an inverting terminal and a non-inverting terminal are short-circuited, and (ii) no feedback of the output voltage to an input of the operational amplifier is carried out.

According to the invention, the offset in the output voltage of the operational amplifier is converted into the binary logical signal, and the binary logical signal is stored. Then, by using the stored logical signal, the offset in the output voltage is adjusted. Thus, a frequent refreshing process, which has been required in a case of storing an analogue voltage, is no longer necessary. Further, since a case-by-case offset adjustment can be performed, a random variation in the offset is reduced. This is advantageous in designing of a remarkably large-sized element, or in designing mask layout of an LSI. This is because no particular consideration is needed. Further, it is possible to reduce a chip size and a cost.

Thus, it is possible to realize a small-scale offset adjusting circuit which is capable of adjusting an offset while absorbing an offset variation, and which does not require a frequent refreshing process.

In order to achieve the foregoing object, an offset adjusting circuit of the present invention includes: an operational amplifier including an offset adjustment input terminal; a first switching element for short-circuiting a non-inverting input terminal of the operational amplifier and an inverting input terminal of the operational amplifier; a second switching element for disconnecting the inverting input terminal of the operational amplifier from negative-phase input signal; one or more latch circuits each latching an output voltage of the operational amplifier by regarding the output voltage as a binary logical signal which is a logical value being quantized by using a weighted offset adjustment amount; a storage circuit for storing the logical signal latched by each of the latch circuits; and a control circuit for (i) generating in accordance with the logical signal stored in the storage circuit, a signal for adjusting an offset of the operational amplifier, and (ii) supplying the signal to the offset adjustment input terminal, said offset adjusting circuit adjusting an offset in the output voltage.

According to the invention, the first switching element short-circuits the non-inverting input terminal of the operational amplifier to the inverting input terminal of the operational amplifier, and the second switching element disconnects the negative-phase input terminal of the operational amplifier from the negative-phase input signal. This creates a status in which an offset occurs in the output voltage of the operational amplifier. Then, each of the latch circuits latches the output voltage (i.e. offset) by regarding the output voltage as the binary logical signal which is the logical value quantized by using the weighted offset adjustment amount. This binary logical signal is stored in the storage circuit. Then, the control circuit generates the signal for adjusting the offset of the operational amplifier based on the logical signal having been stored, and inputs the signal to the offset adjustment input terminal so as to adjust the offset.

As described, the offset in the output voltage of the operational amplifier is converted into the binary logical signal, and the binary logical signal is stored. Then, by using the stored logical signal, the offset in the output voltage is adjusted. Thus, a frequent refreshing process, which has been required in a case of storing an analogue voltage, is no longer necessary. Further, since a case-by-case offset adjustment can be performed, a random variation in the offset is reduced. This is advantageous in designing of a remarkably large-sized element, or in designing mask layout of an LSI. This is because no particular consideration is needed. Further, it is possible to reduce a chip size and a cost.

Thus, it is possible to realize a small-scale offset adjusting circuit which is capable of adjusting an offset while absorbing an offset variation, and which does not require a frequent refreshing process.

Additional objects, features, and strengths of the present invention will be made clear by the description below. Further, the advantages of the present invention will be evident from the following explanation in reference to the drawings.

DESCRIPTION OF THE EMBODIMENTS

The following describes an embodiment of the present invention with reference to the drawings.

Figure 1:
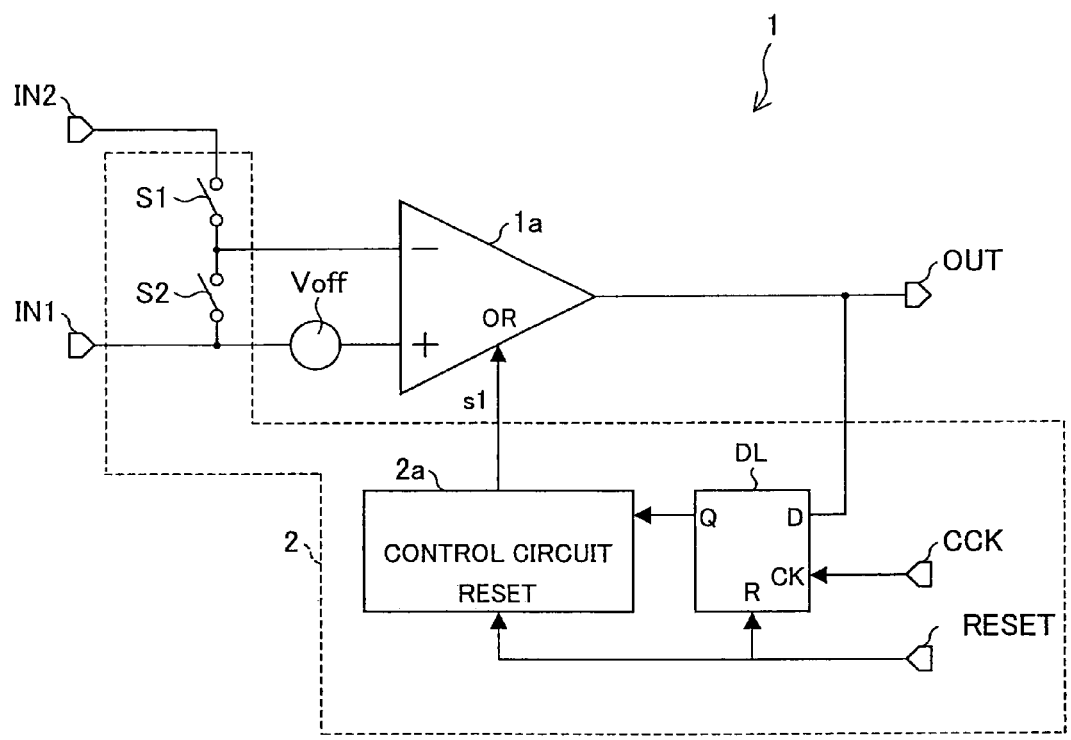
FIG. 1 is an embodiment of the present invention, and is a circuit block diagram illustrating a configuration of the main part of an operational amplifier circuit including first offset adjusting circuit.

FIG. 1 is a circuit block diagram of an embodiment in accordance with the present invention, and is illustrating a configuration of an operational amplifier circuit including a first offset adjusting circuit.

An operational amplifier circuit 1 includes: an operational amplifier 1a; an offset adjusting circuit 2; a common phase input terminal IN1; a negative-phase input terminal IN2; and an output terminal OUT. Note that, an offset of an output voltage of the operational amplifier 1a is represented by a voltage source Voff which serves as a power source: i.e., an input offset of an inphase input signal. This voltage source Voff is provided between a non-inverting input terminal of the operational amplifier 1a and the common phase input terminal IN1. Accordingly, a cause of an offset is removed from the operational amplifier 1a itself illustrated in the figure. However, a cause of an offset is actually included inside the operational amplifier 1a. In the following, "operational amplifier 1a in the figure" means that a voltage source Voff is provided as described above.

The common phase input terminal IN1 is a terminal from which a common phase input signal is input to a non-inverting input terminal of the operational amplifier 1a. The negative-phase input terminal IN2 is a terminal from which a negative-phase input signal is input to an inverting input terminal of the operational amplifier 1a.

The operational amplifier 1a includes an offset adjustment input terminal OR.

The offset adjusting circuit 2 includes: switching elements S1 and S2; a latch circuit DL; a control circuit 2a; a latch pulse input terminal CCK; and a reset signal input terminal RESET.

The switching element (first switching element) S2 short-circuits or electrically disconnects (i) an inverting input terminal of the operational amplifier 1a to or from (ii) a non-inverting input terminal. In the operational amplifier 1a of the figure, one end, of the switching element S1, on the side of the non-inverting input terminal is connected to a point between the voltage source Voff and the common phase input terminal IN1. The switching element (second switching element) S1 short-circuits or electrically disconnects (i) the inverting input terminal of the operational amplifier 1a to or from (ii) the negative-phase input terminal IN2.

The latch circuit DL is a logical circuit for latching an output voltage of the operational amplifier 1a, and is configured by a static logical circuit. This latch circuit DL (i) latches, in response to an input of a later-described latch pulse to the latch pulse input terminal CCK, an output voltage which is input to the input terminal D from the operational amplifier 1a, and (ii) outputs, from the output terminal Q, a logical value according to the latched output voltage. Then, the control circuit 2a converts the logical value output from the latch circuit DL into an offset adjustment signal s1 which is an analogue voltage, and inputs the offset adjustment signal s1 to the offset adjustment input terminal OR of the operational amplifier 1a.

The latch pulse instructs the latch circuit DL to perform a latching operation, and this latch pulse is input to the latch pulse input terminal CCK. Further, a reset pulse which initializes the latch circuit DL and the control circuit 2a is input to the reset pulse input terminal RESET. The reset pulse input terminal RESET is connected to (i) a reset input terminal R of the latch circuit DL and (ii) the control circuit 2a.

When an offset adjustment is carried out in the operational amplifier circuit 1 of FIG. 1, the switching element S1 is opened and the switching element S2 is closed, so that the non-inverting input terminal and the inverting input terminal of the operational amplifier 1a are short-circuited while no output-to-input feedback of an output voltage is carried out with respect to the operational amplifier 1a. Further, a reset pulse is input to the reset pulse input terminal RESET, so as to initialize the latch circuit DL and the control circuit 2a. At this point, when: (i) an open-loop gain of the operational amplifier is sufficiently large, and (ii) the operational amplifier 1a has a positive offset voltage, an output voltage of the operational amplifier 1a rises, and is saturated at substantially a positive power source voltage. On the other hand, when: (i) the open-loop gain of the operational amplifier is sufficiently large, and (ii) the operational amplifier 1a has a negative offset voltage, an output voltage of the operational amplifier 1a drops, and is saturated at substantially a negative power source voltage.

These two types of the output voltages are associated with a logical value of "1" or "0", and are regarded as a binary signal. In accordance with the output voltage of the operational amplifier 1a, the latch circuit DL latches the logical value, in response to an input of a latch pulse to the latch pulse input terminal CCK. When the Q-output from the latch circuit DL is input to the control circuit 2a, the control circuit 2a carries out, in accordance with a logical value indicated by the Q-output, a fine adjustment of the offset adjustment signal s1 so that an offset of the output voltage of the operational amplifier 1a is reduced. After the offset adjustment signal s1 is input to the offset adjustment input terminal OR, the operational amplifier 1a outputs, to the output terminal OUT, an output voltage which has been adjusted by the offset adjustment signal s1. Then, the input of the latch pulse to the latch pulse input terminal CCK and the fine adjustment of the offset adjustment signal s1 are repeated a necessary number of times, so that an offset of the output voltage of the operational amplifier 1a is made as close to zero as possible. During this process, the logical values of "1" and "0" of the logical signal are sequentially accumulated in the control circuit 2a, and the offset adjustment signal s1 is modified little by little. Here, in the offset adjusting circuit 2, the control circuit 2a serves as a storage circuit for storing therein the binary logical signal.

As described, in the offset adjusting circuit 2, the binary logical signal is a logical value which is quantized by using a weighted offset adjustment amount. If an offset is in the positive direction, the latch circuit DL outputs the logical value of "1", and the offset is moved in the negative direction by a weighted adjusting amount which varies depending on how many times a latching operation has been repeated. Meanwhile, if an offset is in the negative direction, the latch circuit DL outputs the logical value "0", and the offset is moved in the positive direction. The moving amount becomes smaller with an increase in the number of latching operation performed.

After the completion of the offset adjustment, the switching element S2 is opened and the switching element S1 is closed. Thus, the operational amplifier 1a enters the normal status. The logical signal data used for the offset adjustment is stored, as logical data, in a storage circuit (not shown) which is provided in the latch circuit DL or the control circuit 2a. After the offset adjustment is completed once, the offset adjustment is performed in the same manner.

As a result of not feedbacking an output from the operational amplifier 1a to the input of the same, if the operational amplifier circuit 1 is a transconductance amplifier, the output terminal OUT is preferably connected to a load. Here, an offset in the output voltage of the operational amplifier 1a is a deviation in a value of a current from the output terminal OUT. The output voltage of the operational amplifier 1a therefore is determined in accordance with the current flowing in a latter stage. If the currents, which flow in the PMOS transistor and the NMOS transistor on the output stage, are balanced while no offset occurs in the output voltage of the operational amplifier 1a, the current does not flow in the load, and a problem therefore does not occur. If not so, the current tries to flows in the load. Further, in this case, an abnormal voltage is generated in the output terminal OUT if the output terminal OUT is electrically disconnected from the load.

Figure 2:
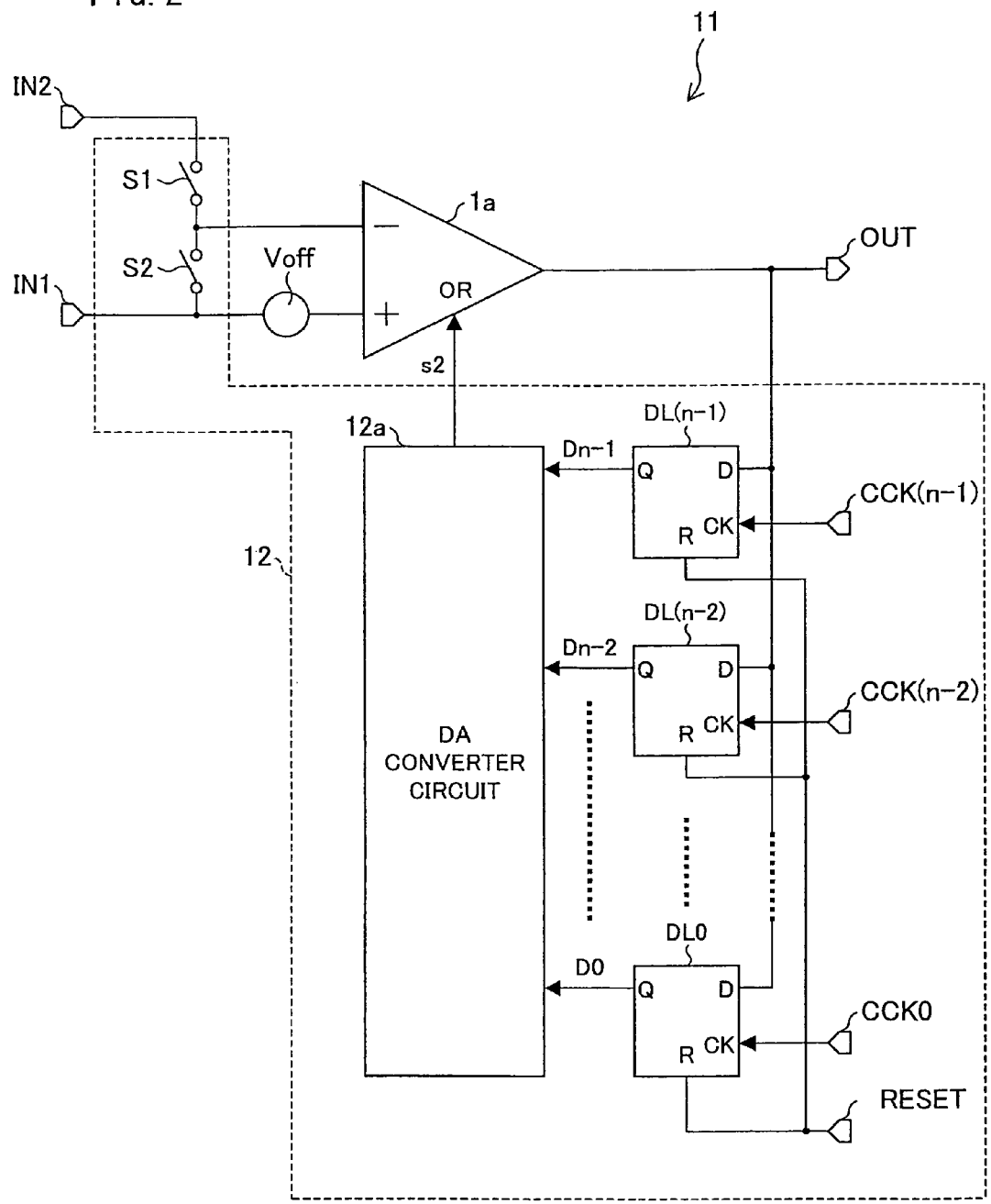
FIG. 2 is another embodiment of the present invention, and is a circuit block diagram illustrating a configuration of the main part of an operational amplifier circuit including a second offset adjusting circuit.

Next, FIG. 2 shows another embodiment of the present invention, and is illustrating a configuration of an operational amplifier circuit 11 including a second offset adjusting circuit.

The operational amplifier circuit 11 is the same as the operational amplifier circuit 1 of FIG. 1, except in that an offset adjusting circuit 12 is provided instead of the offset adjusting circuit 2. The offset adjusting circuit 12 has the same configuration as that of the offset adjusting circuit 2, except in that the offset adjusting circuit 12 includes n latch circuits DL (n-1) to DL0, and that the offset adjusting circuit 12 includes a DA converter 12a instead of the control circuit 2a. Further, each of the latch circuits DL (n-1) to DL0 is configured by a static logical circuit. A latch pulse is individually input to latch pulse input terminals CCK (n-1) to CCK0 which are respectively provided to the latch circuit DL (n-1) to DL0. A reset pulse is commonly input to respective reset input terminals R of the latch circuits DL (n-1) to DL0.

The latch circuits DL (n-1) to DL0 function as an n-bit latch circuit. Each of the latch circuit DL (n-1) to DL0 latches, in response to an input of a latch pulse, an output voltage input to the input terminal D from the operational amplifier 1a. If the output voltage is positive, "1" is output from the output terminal Q, and "0" is output if the output voltage is negative. Amongst the output signals Dn-1 to D0 respectively output from the latch circuits DL (n-1) to DL0, the output signal Dn-1 is the most significant bit and the output signal D0 is the least significant bit. These output signals are binary-weighted logical values. The output signals Dn-1 to D0 are input to the DA converter 12a, as a binary logical signal which takes these logical values.

As described, in the offset adjusting circuit 12, the binary logical signal takes a logical value which is quantized by using a weighted offset adjustment amount. Here, an offset is adjusted as follows. Namely, a bit-by-bit weighting is carried out so that an offset is moved in the negative direction. Then, if the remaining offset is still in the positive direction, a value of a bit is the logical value of "1". On the other hand, if the remaining offset is in the negative direction, the value of the bit is the logical value of "0". Here, in a case where the bit-by-bit weighting is carried out for moving an offset in the negative direction, the value of the bit is the logical value "1", if the remaining offset is in the negative direction, and the value of the bit is the logical value of "0", if the remaining offset is in the positive direction.

The DA converter (control circuit) 12a performs a digital-analog conversion with respect to the digital output signals Dn-1 to D0, so as to generate an offset adjustment signal s2 which is an analogue voltage. Then, the DA converter (control circuit) 12a inputs the generated offset adjustment signal s2 to the offset adjustment input terminal OR of the operational amplifier 1a. The offset adjustment signal s2 is a total of bit-based voltages. The bit-based voltages includes (i) a voltage, based on a bit of "1", which moves an offset in the negative direction by an amount corresponding to how the bit is weighted; and/or (ii) a voltage, based on a bit of "0", which causes no movement of the offset.

When an offset adjustment is carried out in the operational amplifier circuit 11 of FIG. 2, the switching element S2 is opened and the switching element S1 is closed, so that the non-inverting input terminal and the inverting input terminal of the operational amplifier 1a are short-circuited, while no output-to-input feedback is carried out with respect to the operational amplifier 1a. Further, the reset pulse is input to each reset pulse input terminal RESET, so as to (i) initialize the latch circuits DL (n-1) to DL0, and (ii) reset the output signals Dn-1 to D0 at "0". At this point, the DA converter 12a outputs an offset adjustment signal s2 which corresponds to an n-bit binary digit "00 . . . 0,", and supplies the offset adjustment signal s2 to the offset adjustment input terminal OR. Here, when a signal "00 . . . 0" is input to the DA converter 12a, the output voltage of the operational amplifier 1a has the strongest positive offset. In this case, the output voltage of the operational amplifier 1a rises to the positive power source voltage, and is saturated.

Next, a latch pulse is input to the latch pulse input terminal CCK (n-1), so that the latch circuit DL (n-1) latches an output voltage of the operational amplifier 1a. Since the output voltage of the operational amplifier 1a is saturated in the positive direction, the latch circuit DL (n-1) outputs "1", and a signal to be input to the DA converter 12a changes to "10 . . . 0". Since the most significant bit is "1", the offset adjustment signal s2 (i.e. output signal from the DA converter 12a) causes the offset, in the output voltage of the operational amplifier 1a, to move in the negative direction by an amount corresponding to the most significant bit. At this point, if the offset is still in the positive direction, the output voltage rises and is saturated at the positive power source voltage. On the other hand, if the offset is negative, the output voltage drops and is saturated at the negative power source voltage.

Subsequently, the latch pulse is again input to the latch pulse input terminal CCK (n-1), so that the latch circuit DL (n-1) once again latches the output voltage of the operational amplifier 1a. This time, a logical value which is input as DL(n-1) to the DA converter 12a is "1" or "0" according to a sign of the offset in the output voltage of the operational amplifier 1a. Thus, the most significant bit Dn-1 is determined to be such a maximum value that the offset in the output voltage does not become a negative offset. That is, if the offset remains to be positive after the input signal of "10 . . . 0" from the DA converter 12a is input, the Dn-1 is "1", and the input signal from the DA converter 12a is "10 . . . 0". If the offset becomes negative after the input of the input signal "10 . . . 0," from the DA converter 12a, the Dn-1 is "0", and the input signal from the DA converter 12a is "00 . . . 0".

Similarly, an adjustment value from the Dn-2 is determined by inputting twice a latch pulse to the latch pulse input terminal CCK (n-2). In this way, data sets to be output from the successive latch circuits are determined from the upper bit to the lower bit. This makes an offset as close to zero as possible, and yet keeps the offset from occurring in the negative direction.

After the value of the lowest-order bit D0 is determined, the switching element S1 is opened and the switching element S2 is closed. Thus, the operational amplifier 1a enters the normal status. The offset adjustment data is saved, in the form of n-bit binary data, in the latch circuits DL (n-1) to DL0. Once the offset adjustment is completed, the offset adjustment data stored in the latch circuits DL(n-1) to DL0 is maintained. Here, in the offset adjusting circuit 12, the latch circuits DL (n-1) to DL0 serve as a storage circuit which stores the binary logical signal.

In the above configuration, the output voltage of the operational amplifier 1a has the strongest positive offset when the input signal from the DA converter 12a is "00 . . . 0". However, the present invention is not limited to this. It is possible that the output voltage of the operational amplifier 1a has the strongest negative offset when the input signal from the DA converter 12a is "00 . . . 0". In this case, if the offset in the output voltage of the operational amplifier 1a is in the negative direction, the each of the latch circuits DL (n-1) to DL0 outputs "1", and the DA converter 12a allots a voltage which moves the offset in the positive direction according to the bit having been input to the DA converter 12a. Meanwhile, if the offset in the output voltage of the operational amplifier 1a is in the positive direction, the each of the latch circuits DL (n-1) to DL0 outputs "0", and the DA converter 12a allots a voltage which causes the offset not to move. Further, since the logical values are not limited as long as they are distinguishable. Therefore, the logical values of "1" and "0" may be used other way around.

Figure 3:
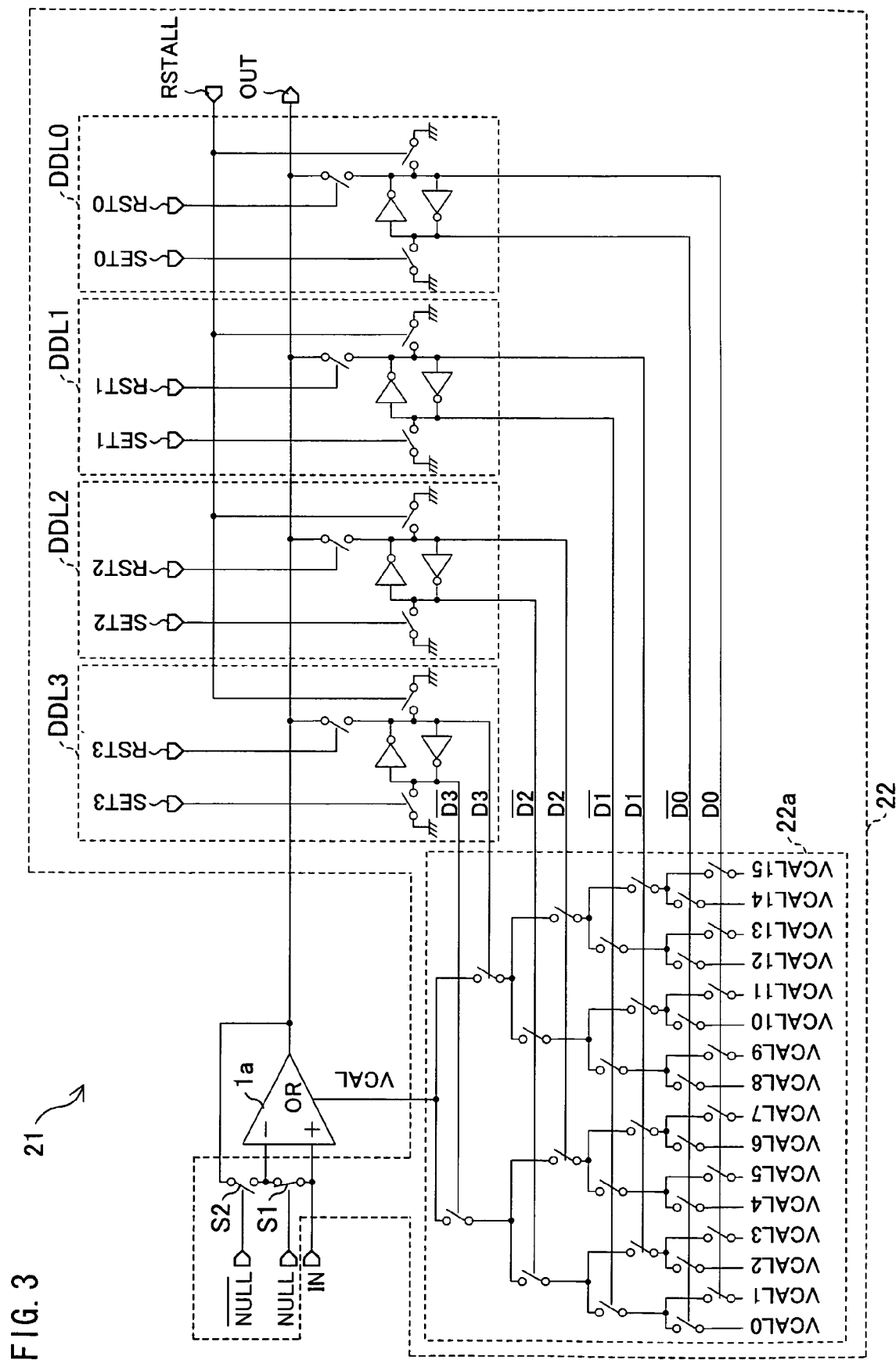
FIG. 3 is yet another embodiment of the present invention, and is a circuit block diagram illustrating a configuration of the main part of an operational amplifier circuit including a third offset adjusting circuit.

Next, FIG. 3 is yet another embodiment of the present invention, and is illustrating a configuration of an operational amplifier circuit 21 including a third offset adjusting circuit.

The operational amplifier circuit 21 is the operational amplifier circuit 11 of FIG. 2 being configured in the form of a voltage follower circuit with a use of the operational amplifier 1a. This operational amplifier circuit 21 includes an offset adjusting circuit 22 instead of the offset adjusting circuit 12. The offset adjusting circuit 22 includes: latch circuits DDL4 to DDL0 instead of the latch circuits DL (n-1) to DL0 of the offset adjusting circuit 12; and a DA converter 22a instead of the DA converter 12a of the offset adjusting circuit 12. Further, each of the latch circuits DDL4 to DDL0 are configured by a static logical circuit.

Further, a signal for controlling on/off statuses of the switching element S1 is referred to as signal NULL, and a signal for controlling on/off statuses of the switching element S2 is referred to as signal /NULL (NULL bar) which is an inverted signal of the signal NULL.

In response to an input of a set signal to the set input terminals SETk (where k=1,2,3, or 4), each of the latch circuits DDLk outputs: (i) output data Dk which is a high-level voltage (logical value of "1"), or (ii) output data /Dk (Dk bar) which is a low-level voltage (logical value of "0"). Further, in response to an input of a reset signal to the reset input terminals RSTk, each of the latch circuits DDLk latches an output voltage of the operational amplifier 1a by regarding the output voltage as a logical value of "1" or "0". If the output voltage is regarded as "1", a high-level voltage is output as output data Dk. On the other hand, if the output voltage is regarded as "0", a low-level voltage is output as output data Dk. Meanwhile, each of the latch circuits DDLk outputs the output data /Dk (Dk bar) whose value is an inversion of the logical value of the output data Dk. Further, in response to an input of a reset signal to a reset input terminal RSTALL which is common for all of the latch circuits DDLk, each of the latch circuits DDLk outputs in unison (i) the output data Dk which is the low-level voltage, and (ii) the output data /Dk (Dk bar) which is the high-level voltage. Once the set signal is input to the latch circuits DDLk, the output data Dk and the output data/Dk (Dk bar) are respectively maintained at the high-level voltage and the low-level voltage, until an input of a reset signal to the reset input terminal RSTk or the reset input terminal RSTALL. Further, once the reset signal is input to the latch circuits DDLk via the reset input terminal RSTALL, the output data Dk and the output data /Dk (Dk bar) are respectively maintained at the low-level voltage and the high-level voltage, until an input of the set signal.

In accordance with the output data pieces D3 to D0 and the output data pieces /D3 to /D0 respectively from the latch circuits DDL3 to DDL0, the DA converter (control circuit) 22a selects an analogue voltage level of an offset adjustment signal VCAL to be input to an offset adjustment input terminal OR of the operational amplifier 1a. Then, the DA converter 22a outputs the offset adjustment signal VCAL. Incidentally, with 4 bits of the output data pieces D3 to D0 from the latch circuits DDL3 to DDL0, it is possible to express 16 analog voltage levels. As such, there are voltages VCAL0 to VCAL15 as the offset adjustment signal VCAL. Here, it is supposed that the voltage level rises in the order from VCAL0, VCAL1, VCAL15. Further, it is supposed that the output data piece D3 is the most significant bit, followed by the output data piece D2, and the output data piece D1. The least significant bit is the output data piece D0.

The DA converter 22a includes many switching elements which are arranged in a tree-like manner. These switching elements are switched on/off so as to form, in accordance with the output data pieces D3 to D0 and /D3 to /D0, a path for inputting any one of voltages VCAL0 to VCAL15 to the offset adjustment input terminal OR. Each of the switching elements is switched to the on-state, while the output data input is the high-level voltage, and is switched to the off-state while the output data input is the low-level voltage. The offset adjustment signal VCAL is input to the offset adjustment input terminal OR, sequentially from the VCAL0 to VCAL15, in accordance with a size of a binary number expressed in 4 bits of the output data pieces D3 to D0; that is, the VCAL0 is input when the binary number is the largest, and the VCAL15 is input when the binary number is the smallest. Further, an amount of the offset moved in the positive direction by the offset adjustment signal VCAL increases in the order from the VCAL0 to VCAL15.

Figure 4:
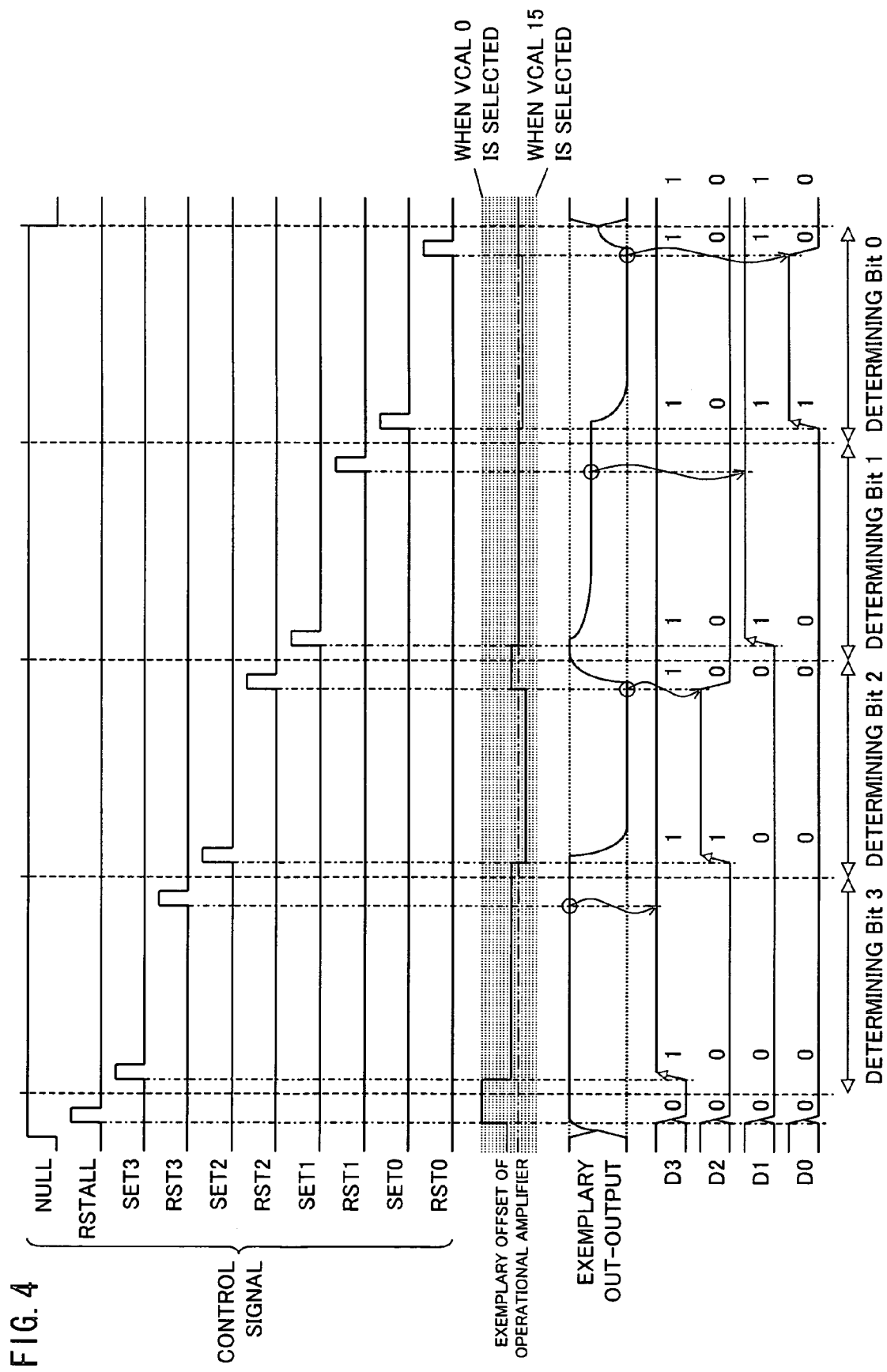
FIG. 4 is a signal timing chart for explaining an offset adjustment operation performed by the operational amplifier circuit of FIG. 3.

FIG. 4 is a timing chart illustrating an operation of the operational amplifier circuit 21 of FIG. 3. An operation of the operational amplifier circuit 21 is the same as that of the operational amplifier circuit 12 of FIG. 2, except in that a value of one bit is determined by separately inputting, once each, a set signal and a reset signal instead of inputting twice the latch pulse CCK. In other words, in the operational amplifier circuit 21, a set input terminal SETk and a reset terminal RSTALL are provided, so that the logical signal latched by the latch circuits DDLk can be set independently of the output voltage of the operational amplifier 1a.

First, as illustrated in FIG. 4, the signal NULL is the high-level voltage, and the signal/NULL is the low-level voltage, so that the switching element S1 is closed and the switching element S2 is opened. Thus, the non-inverting input terminal and the inverting input terminal of the operational amplifier 1a are short-circuited, and the output-to-input feedback is not carried out with respect to the operational amplifier 1a. Then, a high level voltage is input as a reset signal to the latch circuits DDL3 to DD10 via the reset input terminal RSTALL. As such, the output data pieces D3 to D0 are the high-level voltage, and the output data pieces /D3 to /D0 are the low-level voltage. Thus, the voltage VCAL0 is selected as the offset adjustment signal VCAL. When the voltage VCAL0 is used for adjusting the offset in the output voltage of the operational amplifier 1a, the strongest positive offset occurs in the output voltage, as indicated by "EXEMPLARY OFFSET OF OPERATIONAL AMPLIFIER" in FIG. 4. At this point, the output voltage is saturated in the positive direction as indicated by "EXEMPLARY OUT-OUTPUT" in FIG. 4.

Subsequently, the high-level voltage is input as a set signal to the latch circuit DDL3 via the set input terminal SET3, so that a signal containing 4 bits of the output data pieces D3 to D0 is "1000". Thus, the voltage VCAL8 is selected as the offset adjustment signal VCAL. When the voltage VCAL8 is input to the offset adjustment input terminal OR, the offset in the output voltage of the operational amplifier 1a moves in the negative direction. In this case, the remaining offset in the output voltage is in the positive direction as indicated by "EXEMPLARY OFFSET OF OPERATIONAL AMPLIFIER" in FIG. 4. Further, the output voltage is still saturated in the positive direction as indicated by "EXEMPLARY OUT-OUTPUT". For the purpose of confirming in which direction (positive or negative direction) the offset occurs, the output voltage of the operational amplifier 1a is input as a reset signal to the latch circuit DDL3 via the reset input terminal RST3. If the output voltage, at this point, is saturated in the positive direction as indicated by "EXEMPLARY OUT-OUTPUT" in FIG. 4, the output data D3 from the latch circuit DDL3 is "1". Therefore, the output data D3 (Bit3) is determined to be "1" and is maintained at "1". The output voltage of the operational amplifier 1a, in this case, remains at the value resulted from the adjustment by using the offset adjustment signal VCAL (voltage VCAL8) which corresponding to "1000".

When the output voltage of the operational amplifier 1a is input as a reset signal to the latch circuit DDL3 via the reset input terminal RST3, the output data D3 from the latch circuit DDL3 is "0", if the output voltage is saturated in the negative direction. Therefore, the output data D3 (Bit3) is determined to be "0", and is maintained at "0". At this point, the output voltage of the operational amplifier 1a returns to the value resulted from the adjustment by using the offset adjustment signal VCAL (voltage VCAL0) which corresponds to "0000".

Next, a set signal of the high-level voltage is input to the latch circuit DDL2 via the set input terminal SET2, so that a signal containing 4 bits of the output data pieces D3 to D0 is "1100". Thus, the voltage VCAL12 is selected as the offset adjustment signal VCAL. When the voltage VCAL12 is input to the offset adjustment input terminal OR, the offset in the output voltage of the operational amplifier 1a moves in the negative direction. In this case, the remaining offset in the output voltage is in the negative direction as indicated by "EXEMPLARY OFFSET OF OPERATIONAL AMPLIFIER" in FIG. 4. Further, the output voltage is saturated in the negative direction as indicated by "EXEMPLARY OUT-OUTPUT". For the purpose of confirming in which direction (positive or negative direction) the offset occurs, the output voltage of the operational amplifier 1a is input as a reset signal to the latch circuit DDL2 via the reset input terminal RST2. If the output voltage, at this point, is saturated in the negative direction as indicated by "EXEMPLARY OUT-OUTPUT" in FIG. 4, the output data D2 from the latch circuit DDL2 is "0". Therefore, the output data D2 (Bit2) is determined to be "0" and is maintained at "0". The output voltage of the operational amplifier 1a, in this case, remains at the value resulted from the adjustment by using the offset adjustment signal VCAL (voltage VCAL8) which corresponds to "1000".

When the output voltage of the operational amplifier 1a is input as a reset signal to the latch circuit DDL2 via the reset input terminal RST2, the output data D3 from the latch circuit DDL2 is "1", if the output voltage is saturated in the positive direction. Therefore, the output data D2 (Bit2) is determined to be "1", and is maintained at "1". The output voltage of the operational amplifier 1a, in this case, remains at the value resulted from the adjustment by using the offset adjustment signal VCAL (voltage VCAL12) which corresponds to "1100".

Next, a set signal of the high-level voltage is input to the latch circuit DDL1 via the set input terminal SET1, so that a signal containing 4 bits of the output data pieces D3 to D0 is "1010". Thus, the voltage VCAL10 is selected as the offset adjustment signal VCAL. When the voltage VCAL10 is input to the offset adjustment input terminal OR, the offset in the output voltage of the operational amplifier 1a moves in the negative direction. In this case, the remaining offset in the output voltage is slightly in the positive direction as indicated by "EXEMPLARY OFFSET OF OPERATIONAL AMPLIFIER" in FIG. 4 (the offset, in the figure, is almost zero, however it is assumed that the offset is slightly in the positive direction). Further, the output voltage is no longer saturated, and is dropped down to a region where the output voltage linearly varies, as indicated by "EXEMPLARY OUT-OUTPUT". For the purpose of confirming in which direction (positive or negative direction) the offset occurs, the output voltage of the operational amplifier 1a is input as a reset signal to the latch circuit DDL1 via the reset input terminal RST1. If the output voltage, at this point, is in the positive direction as indicated by "EXEMPLARY OUT-OUTPUT" in FIG. 4, the output data D1 from the latch circuit DDL1 is "1". Therefore, the output data D1 (Bit1) is determined to be "1," and is maintained at "1". The output voltage of the operational amplifier 1a, in this case, remains at the value resulted from the adjustment by using the offset adjustment signal VCAL (voltage VCAL10) which corresponds to "1010".

When the output voltage of the operational amplifier 1a is input as a reset signal to the latch circuit DDL1 via the reset input terminal RST1, the output data D1 from the latch circuit DDL1 is "0", if the output voltage is in the negative direction. Therefore, the output data D1 (Bit1) is determined to be "0", and is maintained at "0". At this point, the output voltage of the operational amplifier 1a returns to a value resulted from the adjustment by using the offset adjustment signal VCAL (voltage VCAL8) which corresponds to "1000".

Next, a set signal of the high-level voltage is input to the latch circuit DDL0 via the set input terminal SET0, so that a signal containing 4 bits of the output data pieces D3 to D0 is "1011". Thus, the voltage VCAL11 is selected as the offset adjustment signal VCAL. When the voltage VCAL11 is input to the offset adjustment input terminal OR, the offset in the output voltage of the operational amplifier 1a moves in the negative direction. In this case, the remaining offset in the output voltage is in the negative direction as indicated by "EXEMPLARY OFFSET OF OPERATIONAL AMPLIFIER" in FIG. 4. Further, the output voltage is saturated in the negative direction as indicated by "EXEMPLARY OUT-OUTPUT". For the purpose of confirming in which direction (positive or negative direction) the offset occurs, the output voltage of the operational amplifier 1a is input as a reset signal to the latch circuit DDL0 via the reset input terminal RST0. If the output voltage, at this point, is saturated in the negative direction as. indicated by "EXEMPLARY. OUT-OUTPUT" in FIG. 4, the output data D0 from the latch circuit DDL0 is "0". Therefore, the output data D0 (Bit0) is determined to be "0" and is maintained at "0". The output voltage of the operational amplifier 1a, in this case, remains at the value resulted from the adjustment by using the offset adjustment signal VCAL (of the voltage VCAL10) which corresponds to "1010".

When the output voltage of the operational amplifier 1a is input as a reset signal to the latch circuit DDL0 via the reset input terminal RST0, the output data D0 from the latch circuit DDL0 is "1", if the output voltage is saturated in the positive direction. Therefore, the output data D0 (Bit0) is determined to be "1", and is maintained at "1". The output voltage of the operational amplifier 1a, in this case, remains at the value resulted from the adjustment by using the offset adjustment signal VCAL (voltage VCAL 11) which corresponds to "1011".

In this way, a 4-bit logical signal is determined. In the above method, whether or not each bit is "1" or "0" is determined as follows. Namely, when each of the latch circuits DDLk latches the output voltage of the operational amplifier 1a input to the corresponding reset input terminal RSTk, an amount of voltage correction, which voltage corresponding to how the corresponding bit is weighted, is subtracted from the output voltage of the operational amplifier 1a. Then, whether or not each bit is "1" or "0" is determined based on whether or not the subtraction results in a negative value or a positive value. Accordingly, the value remaining after subtracting the voltage adjustment amount does not necessarily have to be saturated in the positive or negative direction. Note, however, that the output voltage in general is easily saturated, when the open-loop gain of the operational amplifier 1a is remarkably large. This is because a region in which the output voltage linearly varies with respect to the input differential voltage is extremely narrowed. Here, as in the offset adjusting circuit 12, the binary logical signal is a logical value quantized by using the weighted offset adjustment amount.

The output data pieces D3 to D0 and /D3 to /D0 stored in the latch circuits DDL3 to DDL0 are kept being stored. Further, the switching element S1 is opened and the switching element S2 is closed, so that the operational amplifier circuit 21 operates as a voltage follower whose offset has been adjusted.

It is possible to eliminate, from the offset adjusting circuit 22 of FIG. 3, the set input terminal SETk and circuit elements therefor, so that the offset adjusting circuit 22 operates in the same manner as the offset adjusting circuit 12 of FIG. 2. Further, FIG. 3 deals with a case where the 4-bit adjustment data is determined and stored. However, it is needless to say that the number of bits can be easily modified.

Further, in the offset adjusting circuit 22, the latch circuits DDL3 to DDL0 serve as a storage circuit for storing the binary logical signal. However, the present invention is not limited to this, and the storage circuit may be in the DA converter 22a, or in both of (i) the latch circuit DDL3 to DDL0 and (ii) the DA converter 22a. In short, the storage circuit is not particularly limited as long as it is a part of a circuit including the latch circuits DDL3 to DDL0 and the DA converter 22a.

Figure 5:
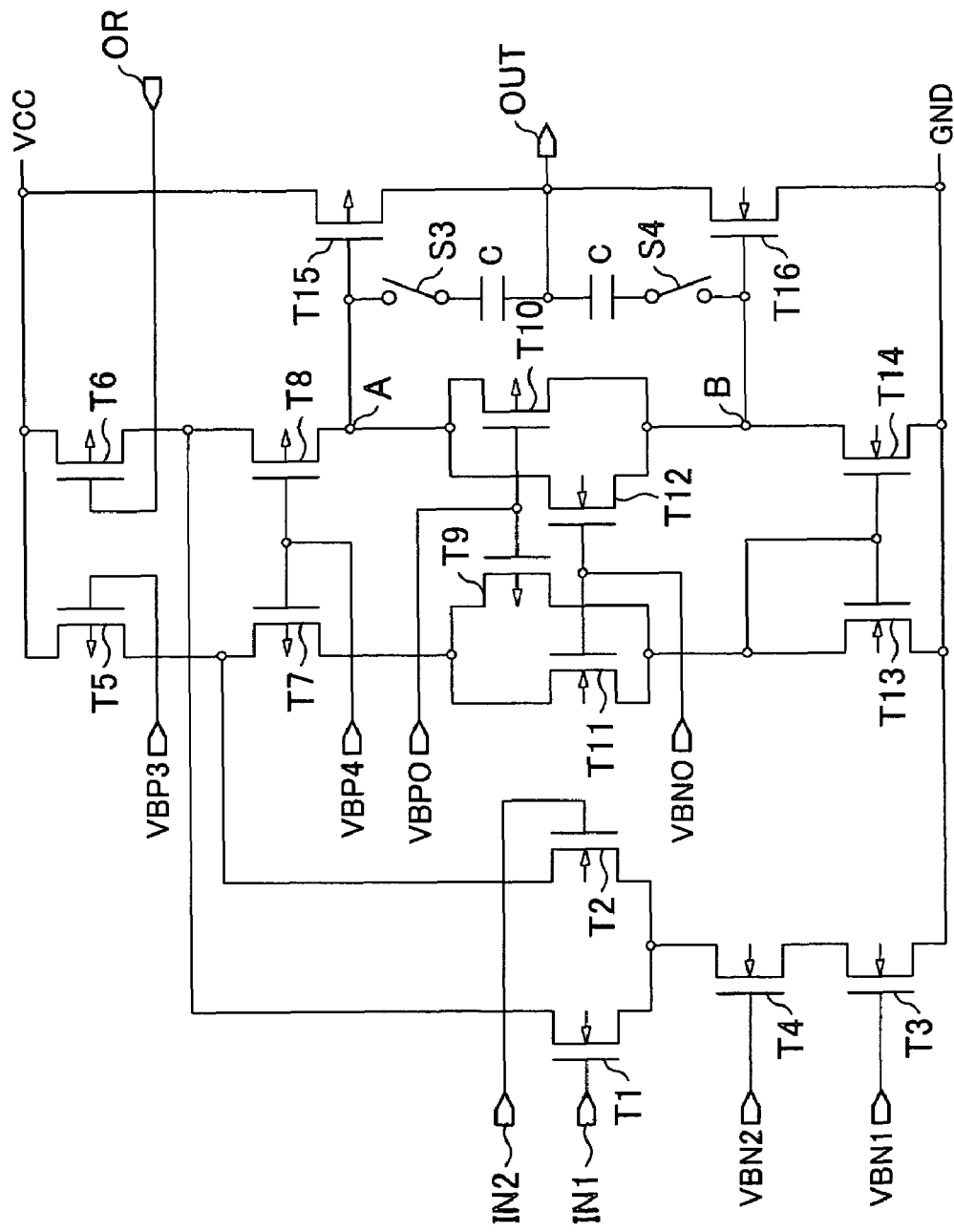
FIG. 5 is a circuit diagram illustrating an exemplary configuration of an operational amplifier having an offset adjusting function.
Figure 6:
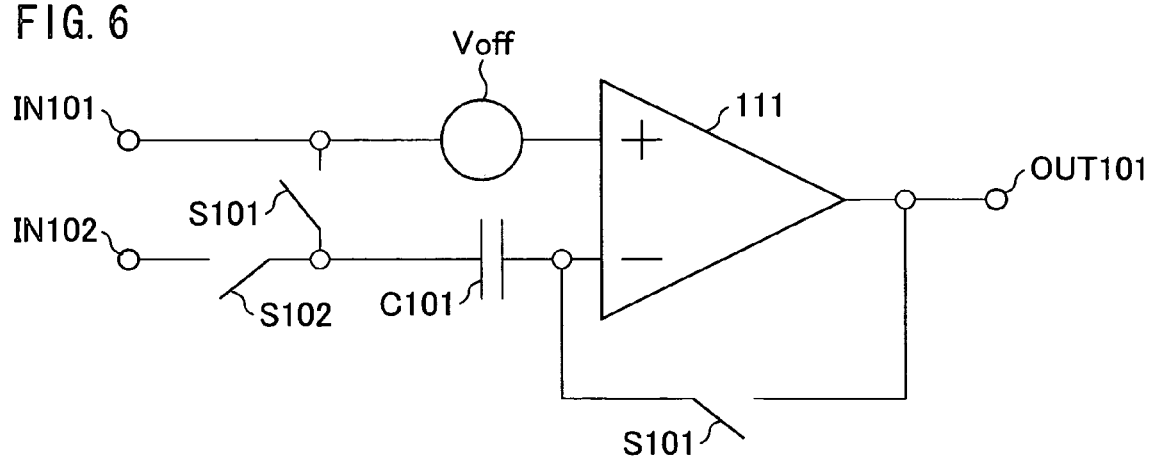
FIG. 6 is a first conventional technology, and is a circuit block diagram illustrating a configuration of the main part of an operational amplifier circuit including an offset adjusting circuit.
Figure 7:
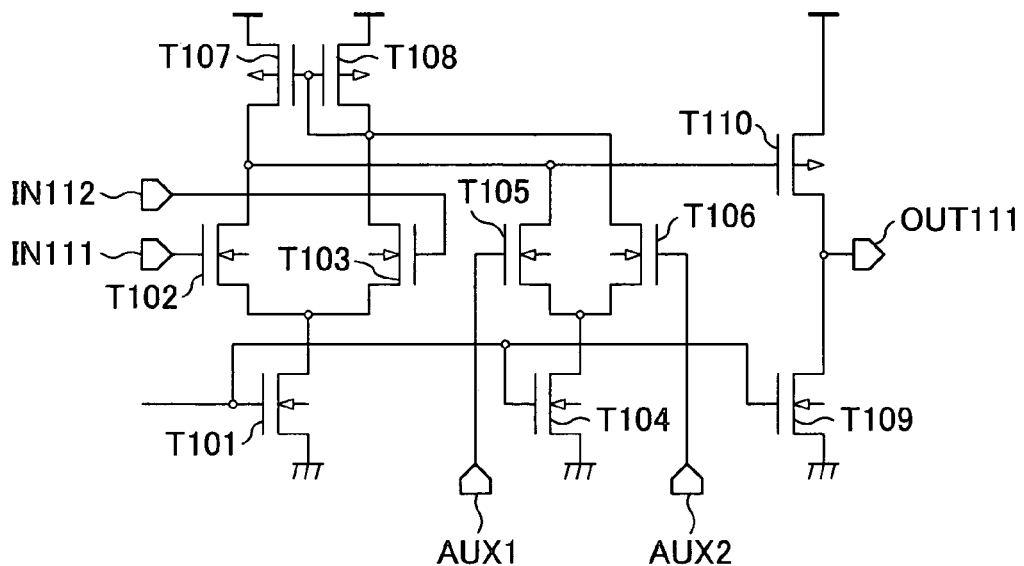
FIG. 7 is a second conventional technology, and is a circuit diagram illustrating an operational amplifier including an offset adjusting circuit.
Figure 8:
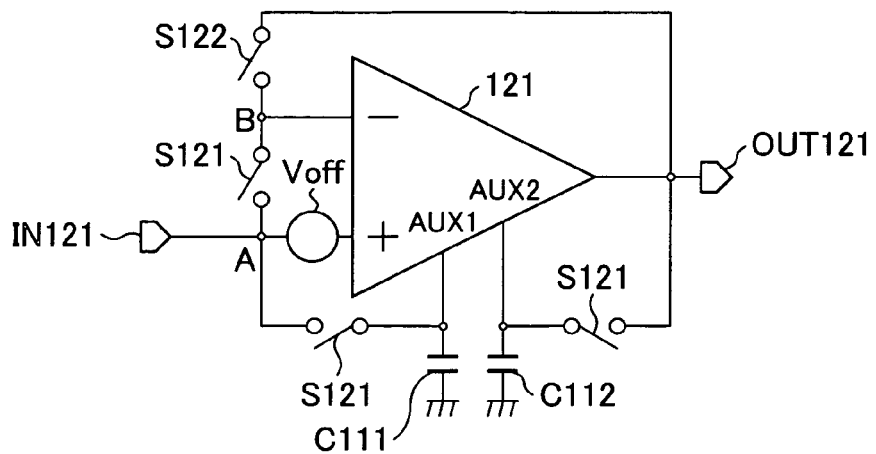
FIG. 8 is a circuit block diagram illustrating a configuration of the main part of an operational amplifier circuit including the operational amplifier of FIG. 7.
Figure 9:
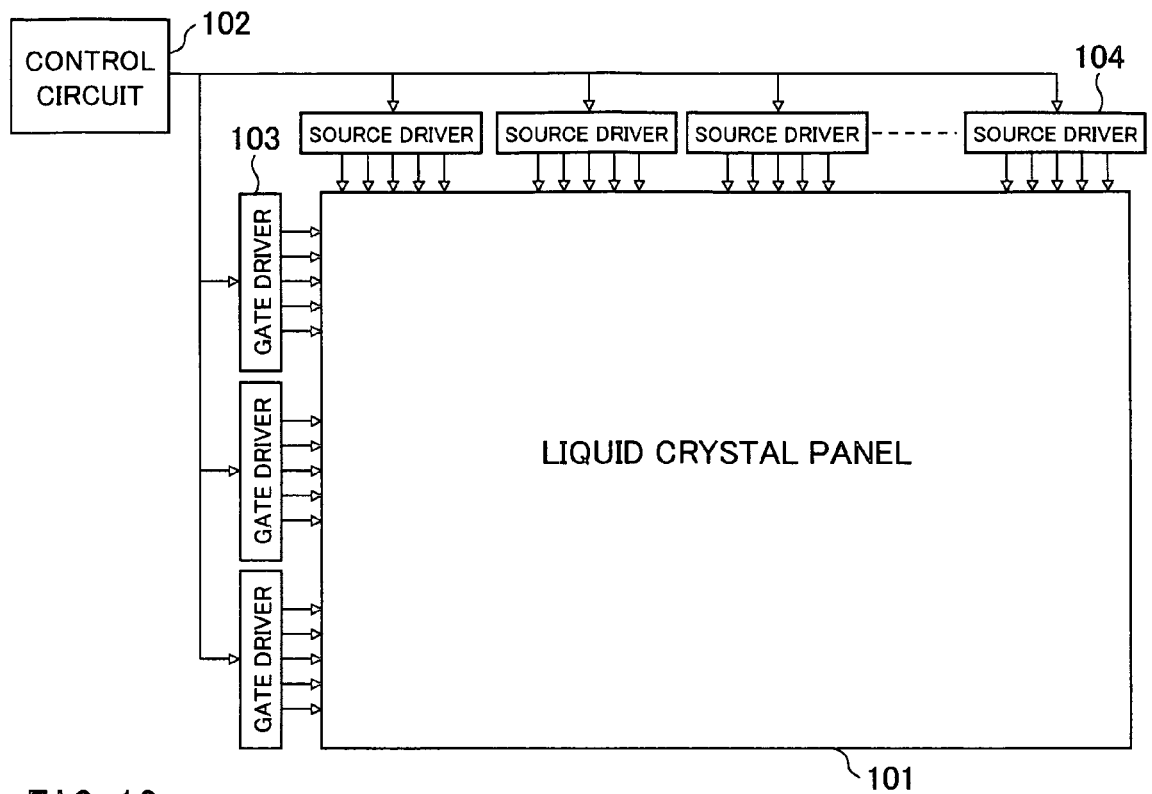
FIG. 9 is a block diagram illustrating a configuration of a TFT-LCD module.
Figure 10:
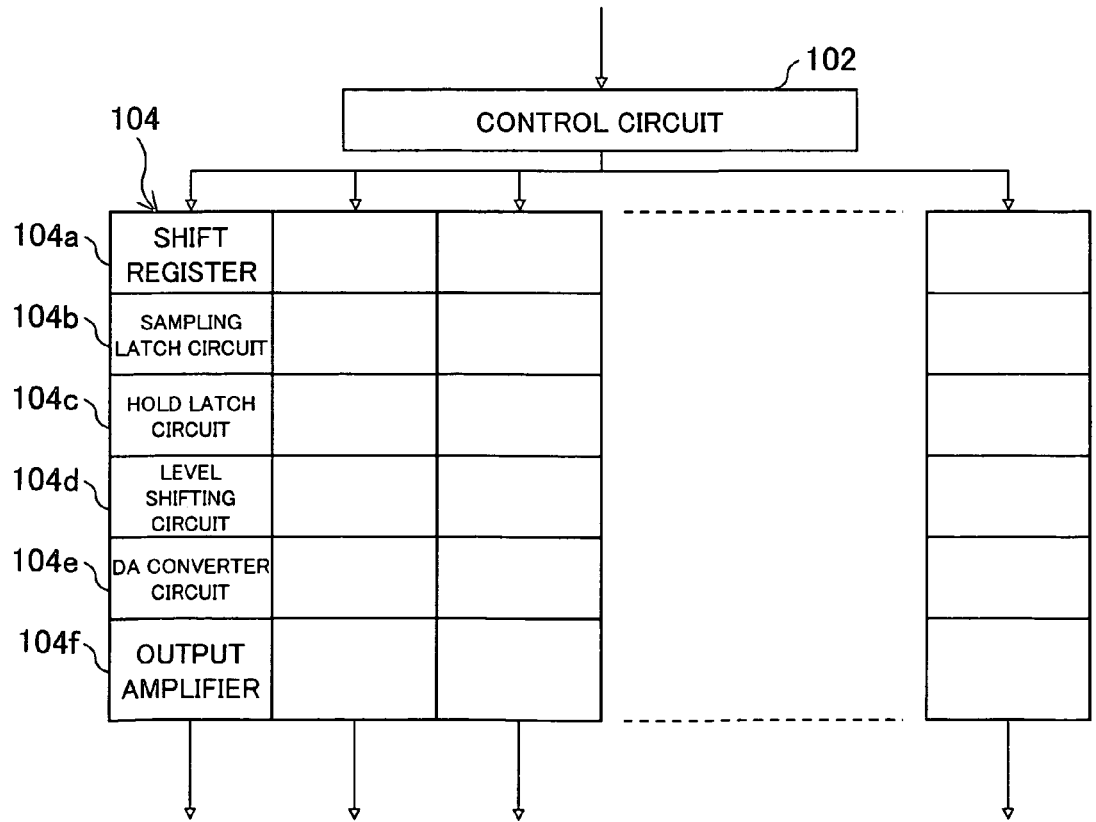
FIG. 10 is a block diagram illustrating a configuration of a source driver circuit in the TFT-LCD module of FIG. 9.
Figure 11:
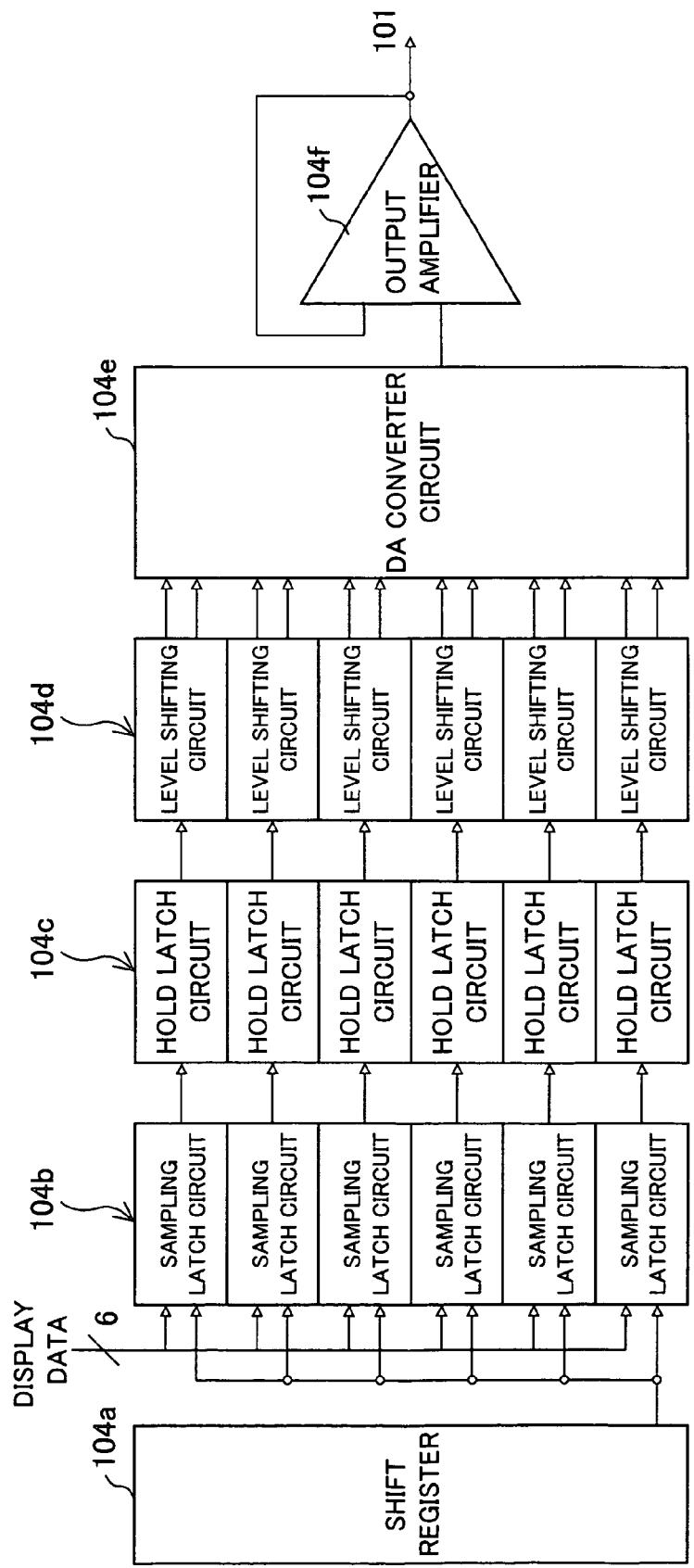
FIG. 11 is a block diagram illustrating a block configuration of each source driver circuit of FIG. 10 corresponding to each source signal line.

Next, FIG. 5 illustrates an example of an operational amplifier used in the present embodiment having an offset adjusting function. The operational amplifier illustrated in FIG. 5 can be used as the operational amplifier 1a illustrated in FIG. 1 or FIG. 3. This operational amplifier is a widely known operational amplifier so-called "folded cascode operational amplifier". Note that the circuit configuration and the offset adjustment input process performed in this operational amplifier is no more than a typical example, and an applicable scope of the present invention is not limited to such a circuit illustrated in FIG. 5.

NMOS transistors T1 and T2 form differential pair transistors. The gate of the NMOS transistor T1 serves as a common phase input terminal IN1 (i.e., non-inverting input terminal), and the gate of the NMOS transistor T2 serves as the negative-phase input terminal IN2 (i.e. inverting input terminal). Between (i) the sources of the NMOS transistors T1 and T2 and (ii) the GND, NMOS transistors T3 and T4 are serially connected. To the gate of the NMOS transistor T3, a voltage VBNi is input. Further, to the gate of the NMOS transistor T4, a voltage VBN2 is input.

The drain of the NMOS transistor T1 is connected to the drain of a PMOS transistor T6, and the drain of the NMOS transistor T2 is connected to the drain of a PMOS transistor T5. The sources of the PMOS transistors T5 and T6 are connected to a power supply VCC. To the gate of the PMOS transistor T5, a voltage VBP3 is input. The gate of the PMOS transistor T6 serves as an offset adjustment input terminal OR.

Between (i) the GND and (ii) the respective drains of the PMO transistors T5 and T6, there are provided: (a) PMOS transistors T7 and T8; (b) a parallel circuit of a PMOS transistor T9 and an NMOS transistor T11; (c) a parallel circuit of a PMOS transistor T10 and an NMOS transistor T12; and (d) a current mirror circuit including NMOS transistors T13 and T14, each of. which is connected in this order.

The source of the PMOS transistor T7 is connected to the drain of the PMOS transistor T5, and the source of the PMOS transistor T8 is connected to the drain of the PMOS transistor T6. To the respective gates of the PMOS transistors T7 and T8, a voltage VBP4 is input. The source of the PMOS transistor T9 and the drain of the NMOS transistor T11 are connected to the drain of the PMOS transistor T7, and the source of the PMOS transistor T10 and the drain of the NMOS transistor T12 are connected to the drain of the PMOS transistor T8 via a point-A. To the gates of the PMOS transistors T9 and T10, a voltage VBP0 is input. Further, to the gates of the NMOS transistors T1 and T12, a voltage VBN0 is input. The drain of the NMOS transistor T13 is connected to (i) the drain of the PMOS transistor T9 and (ii) the source of the NMOS transistor T1. The drain of the NMOS transistor T14 is connected, via a point-B, to (i) the drain of the PMOS transistor T10 and (ii) the source of the NMOS transistor T12. The gates of the NMOS transistors T13 and T14 are connected to each other, and are connected to the drain of the NMOS transistor T13. The sources of the NMOS transistors T13 and T14 are connected to the GND.

Further, the output stage of the operational amplifier is a PMOS transistor T15 and an NMOS transistor T16 which are serially connected between the power source VCC and the GND. The gate of the PMOS transistor T15 is connected to the point-A, and the gate of the NMOS transistor T16 is connected to the point-B. The source of the PMOS transistor T15 is connected to the power source VCC, and the source of the NMOS transistor T16 is connected to the GND. The drain of the PMOS transistor T15 and the drain of the NMOS transistor T16 are connected to each other, and their connection point serves as the output terminal OUT of the operational amplifier.

Further, in the operational amplifier, two phase compensating capacitors C for preventing an oscillation are provided between the point-A and the point-B. More specifically, one of the phase compensating capacitors C is provided between the point-A and the output terminal OUT, and another one of the phase compensating capacitors C is provided between the point-B and the output terminal OUT. Further, a switching element S3 is interposed between (i) the point-A and (ii) the phase compensating capacitor C which is between the point-A and the output terminal OUT. Further, a switching element S4 is interposed between (i) the point-B and (ii) the phase compensating capacitor C which is between the point-B and the output terminal OUT.

These switching elements S3 and S4 are for disconnecting the operational amplifier from the phase compensating capacitor C, while the offset adjustment operation explained with reference to FIG. 1 to FIG. 3 is performed. The disconnection of the operational amplifier from the phase compensating capacitor C improves a high-frequency property of the operational amplifier, thus improving its through rate. This allows a quicker response of an output voltage with respect to the signal input to the offset adjustment input terminal. Thus, it is possible to process, in a shorter timing, the offset adjustment as is the case of the timing chart. In FIG. 2 or FIG. 3, this effect of the accelerated response is particularly remarkable in the offset adjustment using the lower bit, in which a remaining offset voltage is small.

As described, in the offset adjusting circuits 2, 12, and 22 of the present embodiment, an offset in the output voltage of the operational amplifier 1a is converted into a binary logical signal, and the binary logical signal is stored. Then, by using the stored logical signal, the offset in the output voltage is adjusted. This method does not require a frequent refreshing process which is required in a case of storing an analogue voltage. Further, since a case-by-case offset adjustment can be performed, a random variation in the offset is reduced. This is advantageous in designing of a remarkably large-sized element, or in designing mask layout of an LSI. This is because no particular consideration is needed. Further, it is possible to reduce a chip size and a cost.

Thus, it is possible to realize a small-scale offset adjusting circuit which is capable of adjusting an offset while absorbing an offset variation, and which does not require a frequent refreshing process.

As described, an offset adjusting circuit of the present invention: (A) converts an output voltage of an operational amplifier into a binary logical signal, (B) stores the binary logical signal, and (C) uses the binary logical signal for adjusting an offset in the output voltage, said output voltage being output from the operational amplifier while (i) an inverting terminal and a non-inverting terminal are short-circuited, and (ii) no feedback of the output voltage to an input of the operational amplifier is carried out.

According to the invention, the offset in the output voltage of the operational amplifier is converted into the binary logical signal, and the binary logical signal is stored. Then, by using the stored logical signal, the offset in the output voltage is adjusted. Thus, a frequent refreshing process, which has been required in a case of storing an analogue voltage, is no longer necessary. Further, since a case-by-case offset adjustment can be performed, a random variation in the offset is reduced. This is advantageous in designing of a remarkably large-sized element, or in designing mask layout of an LSI. This is because no particular consideration is needed. Further, it is possible to reduce a chip size and a cost.

Thus, it is possible to realize a small-scale offset adjusting circuit which is capable of adjusting an offset while absorbing an offset variation, and which does not require a frequent refreshing process.

Further, the offset adjusting circuit of the present invention is adapted so that said logical signal is a logical value which is quantized by using a weighted offset adjustment amount.

According to the invention, the binary logical signal is the logical value which is quantized by using the weighted offset adjustment amount. This allows an offset adjustment to be performed simply by converting the stored logical signal into an analog signal.

Further, an operational amplifier circuit of the present invention includes: an operational amplifier including an offset adjustment input terminal; a first switching element for short-circuiting a non-inverting input terminal of the operational amplifier and an inverting input terminal of the operational amplifier; a second switching element for disconnecting the inverting input terminal of the operational amplifier from negative-phase input signal; one or more latch circuits each latching an output voltage of the operational amplifier by regarding the output voltage as a binary logical signal which is a logical value being quantized by using a weighted offset adjustment amount; a storage circuit for storing the logical signal latched by each of the latch circuits; and a control circuit for (i) generating in accordance with the logical signal stored in the storage circuit, a signal for adjusting an offset of the operational amplifier, and (ii) supplying the signal to the offset adjustment input terminal, said offset adjusting circuit adjusting an offset in the output voltage.

According to the invention, the first switching element short-circuits the non-inverting input terminal of the operational amplifier to the inverting input terminal of the operational amplifier, and the second switching element disconnects the negative-phase input terminal of the operational amplifier from the negative-phase input signal. This creates a status in which an offset occurs in the output voltage of the operational amplifier. Then, each of the latch circuits latches the output voltage (i.e. offset) by regarding the output voltage as the binary logical signal which is the logical value quantized by using the weighted offset adjustment amount. This binary logical signal is stored in the storage circuit. Then, the control circuit generates the signal for adjusting the offset of the operational amplifier based on the logical signal having been stored, and inputs the signal to the offset adjustment input terminal so as to adjust the offset.

As described, the offset in the output voltage of the operational amplifier is converted into the binary logical signal, and the binary logical signal is stored. Then, by using the stored logical signal, the offset in the output voltage is adjusted. Thus, a frequent refreshing process, which has been required in a case of storing an analogue voltage, is no longer necessary. Further, since a case-by-case offset adjustment can be performed, a random variation in the offset is reduced. This is advantageous in designing of a remarkably large-sized element, or in designing mask layout of an LSI. This is because no particular consideration is needed. Further, it is possible to reduce a chip size and a cost.

Thus, it is possible to realize a small-scale offset adjusting circuit which is capable of adjusting an offset while absorbing an offset variation, and which does not require a frequent refreshing process.

Further, the operational amplifier circuit of the present invention is adapted so that each of said one or more latch circuits is configured by a static logical circuit.

According to the invention, information for adjusting the offset is stored in each of the static logical circuits, instead of storing the information in a dynamic logical circuit which stores the information by charging a capacitor.

Accordingly, it is not necessary to (i) care for a parasitic effect such as feed-through in a switching element, and (ii) add a circuit for adjusting such a parasitic effect. As a result, a chip size and a cost can be reduced.

Further, the offset adjustment is initialized at the time of power activation, and the offset adjustment effect is continuously obtained thereafter. Therefore, frequent refreshing process is no longer necessary, and the output of the operational amplifier is continuously obtained after the completion of the initialization.

Further, the operational amplifier circuit of the present invention is adapted so that the logical signal latched by each of said one or more latch circuits is settable independently of the output voltage.

According to the invention, the logical signal obtained through the latching operation performed in the latching circuit is settable independently of the output voltage of the operational amplifier. This reduces the number of setting processes for setting the output voltage of the operational amplifier for use in the latching operation performed in each of the latching circuits.

Further, the operational amplifier circuit of the present invention is adapted so that the storage circuit is part of a circuit including said one or more latch circuits and the control circuit.

The invention allows a storage circuit to be easily configured. This is because it is easier to provide a storing function if a storage circuit is in a circuit including the latch circuit and the control circuit.

Further, the operational amplifier circuit of the present invention is adapted so that the number of bits of the logical signal equals to the number of a plurality of the latch circuits, and each of the bits indicates either one of the logical values; and said control circuit is a DA converter which performs a digital-analogue conversion with respect to the logical signal.

According to the invention, the logical signal is expressed in a plurality of bits. Further, the control circuit performs the digital-analog conversion with respect to the logical signal. Thus, an offset adjustment can be performed with respect to various types of offsets.

Further, the operational amplifier circuit of the present invention is adapted so that the logical signal is binary-weighted from its higher bit to lower bit.

According to the invention, the logical signal is expressed by using a binary number. This allows easier processing of the logical signal in the logical circuit.

Further, the operational amplifier circuit of the present invention is adapted so that the plurality of the latch circuits latch the output voltage, in an order from (i) a latch circuit corresponding to a most significant bit to (ii) a latch circuit corresponding to a least significant bit; and in each of the latching circuits corresponding to lower bits than the most significant bit, the logical value is determined, while the offset in the output voltage is adjusted by using a logical value which has been determined for a higher bit.

With the invention, it is possible to express both (i) a logical value indicating an offset in the positive direction and (ii) a logical value indicating an offset in the negative direction, in a form of an offset remaining after the offset adjustment by the higher bit.

Further, the operational amplifier circuit of the present invention is adapted so that the operational amplifier includes a circuit element for use in phase compensation; and a switching element for disconnecting the circuit element from the operational amplifier.

With the invention, a high-frequency property and a through rate of the operational amplifier are improved by disconnecting, with the use of the switching element, the phase compensating capacitor from the operational amplifier during the offset adjustment. This accelerates the response of the output voltage with respect to a signal input to the offset adjustment input. Thus, the offset adjustment can be processed in a shorter period.

The present invention is not limited to the embodiments above, but may be altered within the scope of the claims. An embodiment based on a proper combination of technical means disclosed in different embodiments is encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A method of operating an offset adjusting circuit, the method comprising: (A) convertings an output voltage of an operational amplifier into a binary logical signal, (B) storing the binary logical signal, and (C) using the binary logical signal for adjusting an offset in the output voltage, said output voltage being output from the operational amplifier while (i) an inverting terminal and a non-inverting terminal are short-circuited, and (ii) no feedback of the output voltage to an input of the operational amplifier is carried out.

2. The method of claim 1, wherein said logical signal is a logical value which is quantized by using a weighted offset adjustment amount.

3. An operational amplifier circuit, comprising:

an operational amplifier including an offset adjustment input terminal;

a first switching element for short-circuiting a non-inverting input terminal of the operational amplifier and an inverting input terminal of the operational amplifier;

a second switching element for disconnecting the inverting input terminal of the operational amplifier from a negative-phase input signal;

one or more latch circuits each latching an output voltage of the operational amplifier by regarding the output voltage as a binary logical signal which is a logical value being quantized by using a weighted offset adjustment amount;

a storage circuit for storing the logical signal latched by each of the latch circuits; and a control circuit for (i) generating in accordance with the logical signal stored in the storage circuit, an offset adjustment signal for adjusting an offset of the operational amplifier, and (ii) supplying the offset adjustment signal to the offset adjustment input terminal, said operational amplifier circuit being configured to adjusting an offset in the output voltage.

4. The operational amplifier circuit as set forth in claim 3; further comprising one or more static logical circuits for configuring the one or more latch circuits.

5. The operational amplifier circuit as set forth in claim 3, wherein the logical signal latched by each of said one or more latch circuits is settable independently of the output voltage.

6. The operational amplifier circuit as set forth in claim 3, wherein the storage circuit includes said one or more latch circuits and the control circuit.

7. The operational amplifier circuit as set forth in claim 3, wherein:

the operational amplifier is configured so that the number of bits of the logical signal equals the number of a plurality of the latch circuits, and each of the bits indicates either one of the logical values; and said control circuit is a digital-analogue converter for performing a digital-analogue conversion with respect to the logical signal.

8. The operational amplifier circuit as set forth in claim 7, wherein the logical signal is binary-weighted from its higher bit to lower bit.

9. The operational amplifier circuit as set forth in claim 8, wherein:

the plurality of the latch circuits are configured to latch the output voltage, in an order from (i) a latch circuit corresponding to a most significant bit to (ii) a latch circuit corresponding to a least significant bit; and the operational amplifier circuit is configured so that in each of the latching circuits corresponding to lower bits than the most significant bit, the logical value is determined, while the offset in the output voltage is adjusted by using another logical value which has been determined for a higher bit.

10. The method of claim 1, further comprising disconnecting the operational amplifier from a phase compensation circuit element by activating a switching element.

11. The operational amplifier circuit as set forth in claim 9, wherein: the operational amplifier includes a circuit element for use in phase compensation; and a switching element for disconnecting the circuit element from the operational amplifier.

12. An offset adjusting circuit configured to generate an offset adjustment signal for an operational amplifier including an offset adjustment input terminal, and input the offset adjustment signal to the offset adjustment input terminal, the offset adjusting circuit comprising:

a first switching element configured to short-circuit a non-inverting input terminal of the operational amplifier and an inverting input terminal of the operational amplifier;

a second switching element configured to disconnect the inverting input terminal of the operational amplifier from a negative-phase input signal;

one or more latch circuits each configured to latch an output voltage of the operational amplifier by regarding the output voltage as a binary logic signal which is a logic value being quantized by using a weighted offset adjustment amount;

a storage circuit configured to store the logical signal latched by each of the latch circuits; and a control circuit configured to generate in accordance with the logical signal stored in the storage circuit, the offset adjustment signal for the operational amplifier.

* * * * *